(12) United States Patent
Tsao et al.

(10) Patent No.: US 6,638,438 B2
(45) Date of Patent: Oct. 28, 2003

(54) PRINTED CIRCUIT BOARD MICRO HOLE PROCESSING METHOD

(75) Inventors: Ching-Hua Tsao, Taipei (TW); Jou-Yuan Tseng, Taoyuan (TW); Kang-Tsun Liu, Miaoli (TW)

(73) Assignee: Ulisatera Corporation, Hsinchu (TW)

( * ) Notice: Subject to any disclaimer, the term of this patent is extended or adjusted under 35 U.S.C. 154(b) by 91 days.

(21) Appl. No.: 09/977,654

(22) Filed: Oct. 16, 2001

(65) Prior Publication Data

US 2003/0071013 A1 Apr. 17, 2003

(51) Int. Cl.[7] .............. B44C 1/22; C23F 1/00
(52) U.S. Cl. .............. 216/13; 216/17; 216/20; 216/67

(58) Field of Search .............. 216/13, 17, 18, 216/19, 20, 67

(56) References Cited

U.S. PATENT DOCUMENTS 4,624,739 A * 11/1986 Nixon et al. .............. 438/723

* cited by examiner

*Primary Examiner*—William A. Powell
(74) *Attorney, Agent, or Firm*—Browdy and Neimark

(57) ABSTRACT

A PC board micro hole processing method using plasma technique to etch the substrate of the PC board, and then using chemical etching technique to remove residual material such as glass fibers.

10 Claims, 3 Drawing Sheets

PRINTED CIRCUIT BOARD MICRO HOLE PROCESSING METHOD

FIELD OF THE INVENTION

The present invention relates generally to the fabrication of PC (printed circuit) boards and, more particularly, to a PC board micro hole processing method adapted to process micro holes on PC boards.

BACKGROUND OF THE INVENTION

Conventional PC board micro hole processing methods include Mechanical Drilling and Laser Via. These two methods have drawbacks as outlined hereinafter:

1. Mechanical drilling:
   (a) Due to technical limitation, this mechanical drilling method cannot make micro holes of diameter below 0.1 mm.
   (b) Due to low hole-making speed, the micro hole processing cost is high.
   (c) The drill bits used in this mechanical drilling method are expensive, and tend to be damaged during drilling, causing the micro hole processing cost to be relatively increased.
   (d) Due to vibration of the power drill during drilling operation, it is difficult to control the quality of the micro holes.
2. Laser Via:
   (a) Laser Via technique is applicable to make micro holes of small diameter, however due to laser energy and parameter control difficulty, the periphery of every micro hole tends to be carbonized, affecting further PTH (Plated Through Hole) procedure.
   (b) Laser Via technique takes much time to make holes on the PC board, more particularly when processing micro holes on a PC board of thickness over 0.1 mm, and the expensive laser processing equipment greatly increases the micro hole processing cost.
   (c) During the application of Laser Via technique, the PC board will be caused to release gaseous gases including carbon dioxide, polychlorinated biphenyl, and n-propyl bromide that will damage the ozone layer of the atmosphere and pollute the environment.

SUMMARY OF THE INVENTION

The present invention has been accomplished to provide a PC board micro hole processing method, which eliminates the aforesaid drawbacks. It is the main object of the present invention to provide a PC board micro hole processing method, which is efficient, cost-saving, and pollution-free.

To achieve the object of the present invention, the PC board micro hole processing method comprises the step of using plasma technique to etch the substrate of the PC board, and the step of using chemical etching technique to remove residual material (for example, glass fibers) left after the application of plasma technique.

DETAILED DESCRIPTION OF THE INVENTION

Figure 1:
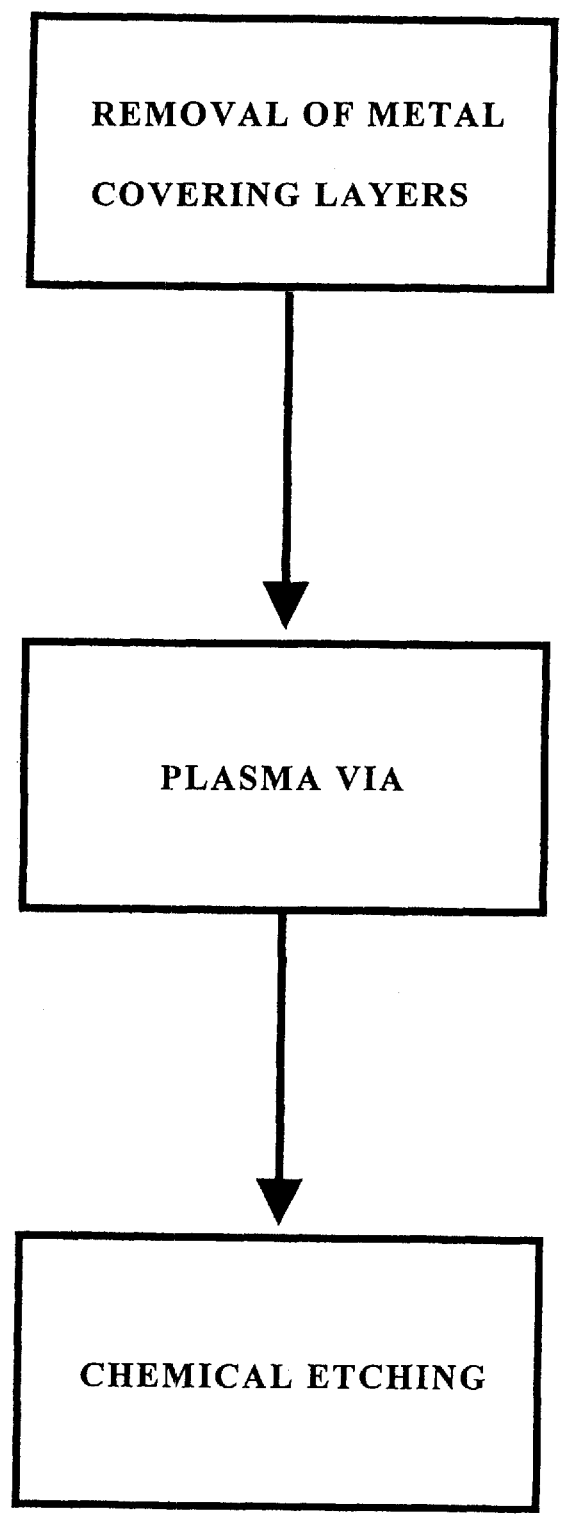
FIG. 1 is a flow chart of the present invention.

Referring to FIG. 1, the method of the invention is adapted to process micro holes on a PC (printed circuit) board. The PC board comprises a glass fiber resin compound substrate, and two metal covering layers covering the top and bottom surfaces of the substrate. The so-called micro holes can be small blind holes, through holes, or buried holes. The method of the present invention comprises the steps of:

1. Removal of metal covering layer, where a series of procedures of dry film photoresist material adhesion, ultraviolet exposure, developing, and chemical etching is applied to remove the metal covering layers from predetermined surface areas of the glass fiber resin compound substrate, enabling the predetermined surface areas of the glass fiber resin compound substrate to be exposed to the outside.

2. Plasma Via, where the PC board is put in a low-tension electric field of predetermined strength, and then a gas, for example, $CF_4$ (carbon tetrafluoride), $O_2$ (oxygen), $H_2$ (hydrogen), Ar (argon), $NF_3$ (nitrogen trifluoride), or $N_2$ (nitrogen) is filled into the low-tension electric field for enabling the filled gas to be decomposed into unstable particles such as electrons, ions, or radical to cause a chemical reaction with the resin of the fiber glass resin compound substrate at the areas where the desired holes are to be made, so that the chemical reaction lowers the molecules of the resin material and causes the resin material to be released in the form of vapor, and at the same time vaporized molecules are drawn away, and therefore the resin material at the desired areas is etched layer by layer to achieve the desired Plasma Via effect.

3. Chemical etching, where a chemical solution is applied to the glass fiber resin compound substrate of the PC board to remove the residual glass fibers left after the process of Plasma Via, finishing the desired micro holes.

Figure 2:
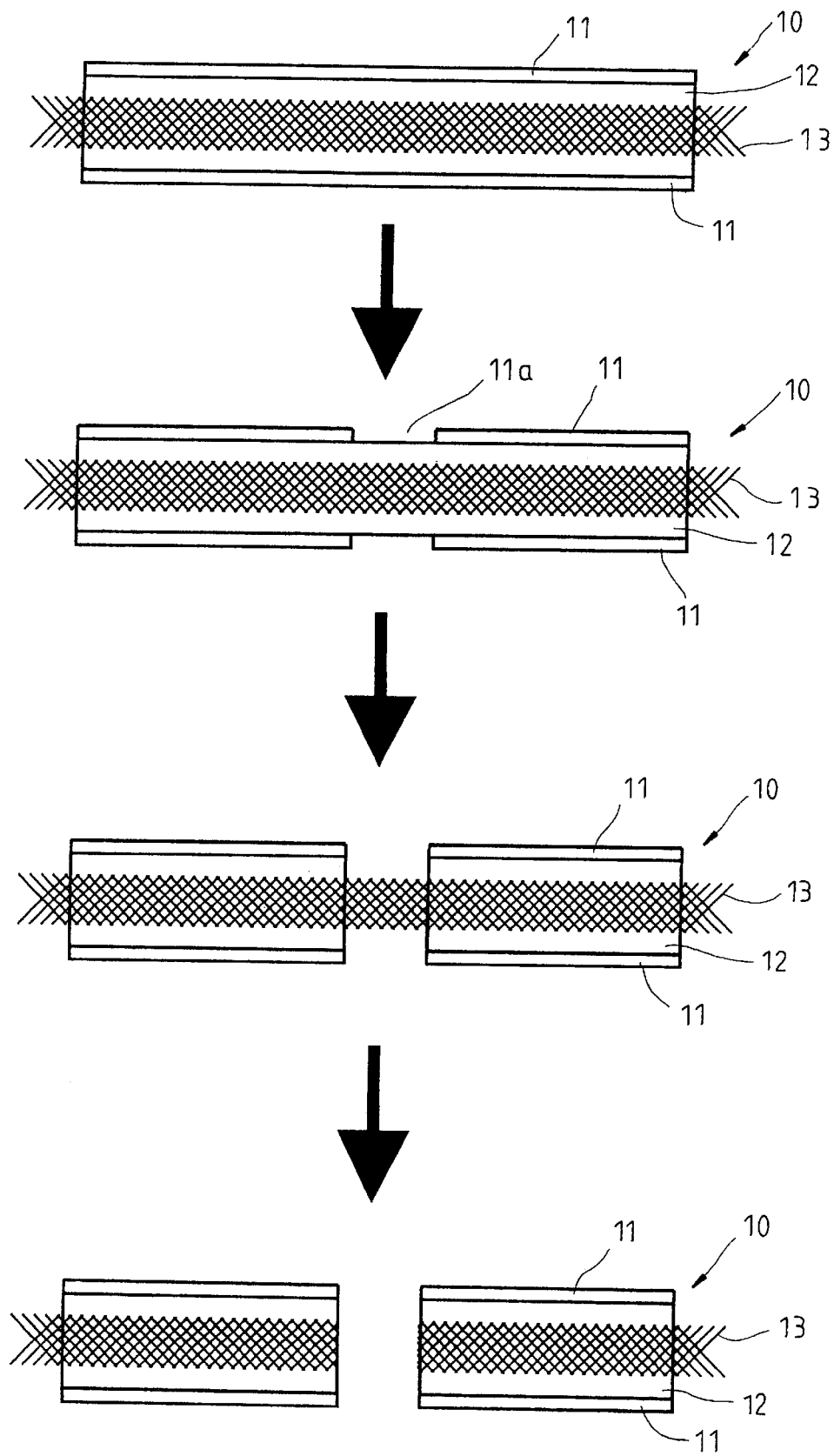
FIG. 2 is a schematic drawing explaining the steps according to the present invention.
Figure 3:
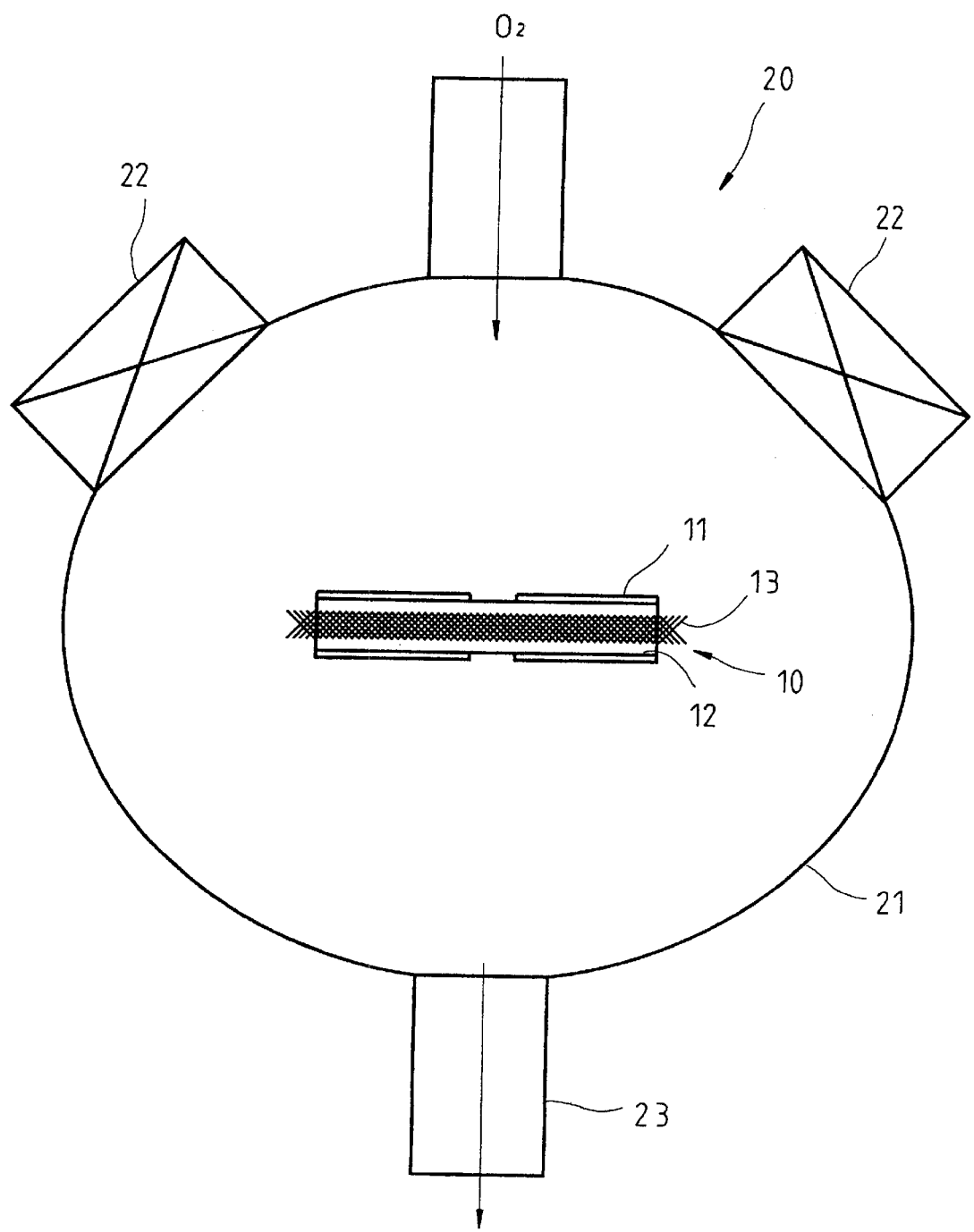
FIG. 3 is a schematic drawing showing a PC board put in the reactive chamber of a plasma equipment and processed according to the present invention.

FIGS. 2 and 3 show an application example of the present invention in detail.

1. Removal of metal covering layer:
   a) At first, coarsen the metal covering layers 11 of the PC board 10 by brush-grinding or micro-etching.
   b) Adhere a dry film photoresist material to the metal covering layers 11 of the PC board 10 under a predetermined temperature and pressure.
   c) Put the PC board 10 into a ultraviolet exposure machine to receive the radiation of ultraviolet rays, where a micro holes layout negative film is used to prohibit the photoresist at the predetermined micro hole areas from the radiation of ultraviolet rays, and to let the other area be radiated by the ultraviolet rays to cause a polymeric reaction.
   d) Use carbonic acid solution to remove the photoresist and to let the respective metal covering layers 11a be exposed to the outside, and then use a solution of hydrochloric acid and hydrogen peroxide to remove the metal covering layers 11a, letting the substrate 12 to be exposed to the outside.
2. Plasma Via:
   a) Put the PC board thus obtained from the aforesaid procedure of "Removal of metal covering layer" in the reactive chamber 21 of a plasma equipment 20, which has two microwave radiating devices 22 that keep the reactive chamber 21 in a low temperature and high electric field strength condition, and a vacuum pump 23 adapted to draw air out of the reactive chamber 21, keeping the reactive chamber 21 in a low pressure condition.

b) Fill oxygen into the reactive chamber 21, enabling oxygen to be energized into active, atom-like oxygen radical, which when touched the exposed substrate 12, causes the surface of the exposed substrate 12 to be oxidized and the chains of the molecules of the exposed substrate 12 to be broken, forming into vapor phase molecules.

c) Draw vapor phase molecules away from the reactive chamber 21 when continuously filling oxygen into the reactive chamber 21, causing oxygen radical to be continuously released from the surface layer to the inner layer and from the center to the outer side until the completion of Plasma Via.

wherein the equation of calculating plasma's average electron energy is:

$$Te = q/k \times 0.30 \times \sqrt{Mm}/Me \times \lambda e1 \times E/P$$

Te: Average electron energy
q: Electron charge
k: Boltzmann constant
Mm: Gaseous molecule
Me: Electron energy
$\lambda el$: Electron free stroke
E: Strength of electric field
P: Pressure And, the average electron energy of oxygen plasma is:

$$Te = 20880 \times E/P$$

The aforesaid equation can be used for the setting of operation coefficient of the pressure and strength of electric field of the reactive chamber.

3. Chemical solvent etching:

a) After Plasma Via, the glass fibers 13 of the glass fibber resin compound material of the substrate 12 of the PC board 10 are remained not removed. Therefore, HF (hydrofluoric acid) solution of concentration 1%~40% is applied under 10° C.~70° C. to remove residual glass fibers 13, finishing the desired micro holes.

According to the aforesaid method, we can make micro holes of diameters below 0.05 on PC boards. By means of conventional mechanical drilling techniques, we cannot to make micro holes of diameters below 0.05. The micro hole formation speed according to the present invention is faster than conventional mechanical technique as well as Laser Via technique. Because the micro hole formation speed of the present invention is faster than the conventional methods and inexpensive gas is used during the fabrication procedure, the manufacturing cost of the present invention is much cheaper than the conventional methods. Further, by means of precised parameter setting, the invention achieves high quality control. Further, the invention eliminates the work site pollution problem that is commonly seen in the fabrication using Laser via technique.

What is claimed is:

1. A PC board micro hole processing method adapted to make micro holes on an PC board, said PC board comprising a substrate of glass fiber resin compound and at least one metal covering layer covered on at least one top and bottom surfaces of said substrate, the method comprising the steps of:

a) removing the metal covering layer, where a chemical etching procedure is employed to remove metal material from predetermined areas of said substrate, enabling the predetermined areas of said substrate to be exposed to the outside;

b) applying the PC board to a low-tension electric field of predetermined strength, and feeding a gas into the low-tension electric field for enabling the gas to be decomposed into electrons, ions, or radicals to cause a chemical reaction with the resin of said substrate at said predetermined areas, so that the chemical reaction lowers the molecules of the resin material and causes the resin material to be released in the form of vapor, and at the same time vaporized molecules thus produced are drawn away, causing the resin material to be etched layer by layer at said predetermined areas; and c) chemically etching, where a chemical solution is applied to said substrate to remove the residual fibers left after the process of applying the PC board to the electric field, finishing the desired micro holes.

2. The PC board micro hole processing method as claimed in claim 1 wherein the step of removing the metal covering layer employs a series of procedures of dry film photoresist material adhesion, ultraviolet exposure, and developing, and then employs a chemical etching procedure to remove metal material at said predetermined areas from said substrate.

3. The PC board micro hole processing method as claimed in claim 1 wherein the gas fed into the low-tension electric field is oxygen ($O_2$).

4. The PC board micro hole processing method as claimed in claim 1 wherein the gas fed into the low-tension electric field is carbon tetrafluoride ($CF_4$).

5. The PC board micro hole processing method as claimed in claim 1 wherein the gas fed into the low-tension electric field is hydrogen ($H_2$).

6. The PC board micro hole processing method as claimed in claim 1 wherein the gas fed into the low-tension electric field is argon (Ar).

7. The PC board micro hole processing method as claimed in claim 1 wherein the gas fed into the low-tension electric field is nitrogen trifluoride ($NF_3$).

8. The PC board micro hole processing method as claimed in claim 1 wherein the gas fed into the low-tension electric field is nitrogen ($N_2$).

9. The PC board micro hole processing method as claimed in claim 1 wherein the chemical solution used during the step of chemically etching is HF (hydrofluoric acid) solution.

10. The PC board micro hole processing method as claimed in claim 9 wherein said hydrofluoric acid solution has the concentration of within 1%~40%, and is maintained at the temperature of 10° C.~70° C.

* * * * *